(12) United States Patent
Wang et al.

(10) Patent No.: US 11,695,090 B2
(45) Date of Patent: Jul. 4, 2023

(54) NANOPHOTONIC HOT-ELECTRON DEVICES FOR INFRARED LIGHT DETECTION

(71) Applicant: THE TRUSTEES OF DARTMOUTH COLLEGE, Hanover, NH (US)

(72) Inventors: Zhiyuan Wang, Lebanon, NH (US); Xiaoxin Wang, Hanover, NH (US); Jifeng Liu, Hanover, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 17/958,868

(22) Filed: Oct. 3, 2022

(65) Prior Publication Data

US 2023/0029519 A1     Feb. 2, 2023

Related U.S. Application Data

(63) Continuation of application No. 16/606,829, filed as application No. PCT/US2018/028688 on Apr. 20, 2018, now Pat. No. 11,462,656.

(60) Provisional application No. 62/487,653, filed on Apr. 20, 2017.

(51) Int. Cl.
| | |
|---|---|
| *H01L 31/0232* | (2014.01) |
| *H01L 31/119* | (2006.01) |
| *H01L 27/146* | (2006.01) |
| *H01L 27/148* | (2006.01) |
| *H01L 27/144* | (2006.01) |

(52) U.S. Cl.
CPC .......... *H01L 31/119* (2013.01); *H01L 27/146* (2013.01); *H01L 27/1446* (2013.01); *H01L 27/14875* (2013.01); *H01L 31/02327* (2013.01)

(58) Field of Classification Search
CPC ............... H01L 24/1446; H01L 24/146; H01L 24/14875; H01L 31/02327; H01L 31/119
See application file for complete search history.

(56) References Cited

PUBLICATIONS

Dereshgi et al. (2017) "Plasmonically enhanced metal-insulator multistacked photodetectors with separate absorption and collection junctions for near-infrared applications", Scientific Reports, vol. 7, Article No. 42349, pp. 1-8. (Year: 2017).*

* cited by examiner

*Primary Examiner* — Mark R Gaworecki
(74) *Attorney, Agent, or Firm* — Cozen O'Connor

(57) ABSTRACT

Disclosed are infrared (IR) light detectors. The detectors operate by generating hot electrons in a metallic absorber layer on photon absorption, the electrons being transported through an energy barrier of an insulating layer to a metal or semiconductor conductive layer. The energy barrier is set to bar response to wavelengths longer than a maximum wavelength. Particular embodiments also have a pattern of metallic shapes above the metallic absorber layer that act to increase photon absorption while reflecting photons of short wavelengths; these particular embodiments have a bandpass response.

11 Claims, 6 Drawing Sheets

NANOPHOTONIC HOT-ELECTRON DEVICES FOR INFRARED LIGHT DETECTION

CROSS-REFERENCE TO RELATED APPLICATIONS

This application is a continuation of U.S. patent application Ser. No. 16/606,829, filed Oct. 21, 2019, issuing as U.S. Pat. No. 11,462,656 on Oct. 4, 2022, which is a 35 U.S.C. § 371 filing of International Application No. PCT/US2018/028688, filed Apr. 20, 2018, which claims the benefit of priority from U.S. Provisional Application No. 62/487,653 filed Apr. 20, 2017, which is herein incorporated by reference in its entirety.

GOVERNMENT RIGHTS

This invention was made with government support under grant no. 1509272 awarded by the National Science Foundation. The government has certain rights in the invention.

FIELD

The present document relates to infrared radiation detectors.

BACKGROUND

For this document, infrared light refers to light in the wavelength range from 700 nm to 1 mm. IR detectors are widely used in telecommunications, chemical and biological agent detection, smoke detectors, thermal and night vision, and other applications. Currently there are two main methods adopted for IR detection. One is sensing changes in electrical conductivity upon IR illumination, including photoconductors. The other is sensing changes in temperature upon IR illumination, including bolometers. The former relies on electron-hole pair generation upon optical excitation, while the latter relies on the slight temperature increase by heating associated with absorption of the illumination of different (IR) light.

Photoconductors in the IR regime often suffer from low efficiency and high dark current. Bolometers often rely on exotic materials such as $V_2O_5$, resulting in a high cost and limited application. Furthermore, bolometers tend to have slow response on the order of milliseconds to seconds.

A second category is photoconductors, usually based on photodiode structures, including semiconductor p-n junction and metal-semiconductor Schottky junction structures. Semiconductor p-n or p-i-n photodiodes require that the band gap of the absorbing semiconductor material should be smaller than the photon energy of the IR light. This requirement becomes increasingly difficult to meet at longer wavelengths as photon energy is low. Fabrication of such devices often involves elaborate heteroepitaxy. Few long-wavelength devices can be monolithically integrated with silicon electronics read-out circuits, which greatly increases the cost and limits their application in large image sensor arrays.

Schottky photodiodes are easy to fabricate because they comprise a layer of metal in contact with a layer of semiconductor. Typically, deposition of metal on a semiconductor is much easier than heteroepitaxy of semiconductor photodiodes. The difference between metal work function and semiconductor work function results in an energy barrier. When IR light is absorbed in metal, some electrons are excited and gain enough energy to overcome the energy barrier and transport to the semiconductor region, thereby generating electric currents. While Schottky photodiodes are simple to make, their noise is usually high compared to semiconductor photodiodes because the metal/semiconductor interface is imperfect, leading to dark current generated by interfacial defects that exceeds the level of regular thermal excitation across the barrier. Responsivity of Schottky photodiodes is lower than that of semiconductor photodiodes because the metal layer is usually too reflective to absorb IR light efficiently. Additionally, nearly all current IR detector systems require exotic compound materials beyond Silicon and use complicated read-out circuits.

SUMMARY

Disclosed are infrared (IR) light detectors. The detectors operate by generating hot electrons in a metallic absorber layer on photon absorption, the electrons transported through an energy barrier of an insulating layer to a metal or semiconductor conductive layer. The energy barrier is set to bar response to wavelengths longer than a maximum wavelength. Particular embodiments also have a pattern of metallic shapes above the metallic absorber layer that act to increase photon absorption while reflecting photons of short wavelengths.

In an embodiment, a metal-insulator-conductor infrared photodetector includes a metallic infrared light absorber layer configured to generate electrons with a first kinetic energy upon absorption of photons of the infrared light. The metallic infrared light absorber layer is disposed over a layer of dielectric material configured to allow passage of electrons having the first kinetic energy while blocking electrons having a second kinetic energy, the dielectric material in turn disposed over a conductive substrate configured to collect electrons passed through the dielectric.

BRIEF DESCRIPTION OF THE DRAWINGS

FIG. 5C illustrates simulated light field distribution indicates the 1550 nm light is more concentrated near metal/oxide than the 800 nm light, thereby offering some spectral selectivity.

DETAILED DESCRIPTION OF THE EMBODIMENTS

We seek to provide a new IR sensing solution with a simple, integrated and fully Si CMOS compatible design. Compared to semiconductor IR detectors, these devices do not require heteroepitaxy of exotic materials and allows monolithic integration with Si read out electronics. Compared to Schottky IR detectors, the interfacial defects are greatly reduced and IR absorption increased in the metallic layer.

We have developed an IR photodetector structure which only responds to certain wavelengths range of IR light. This structure provides an IR detector which can be easily integrated with silicon read-out integrated circuits. This photodetector is fabricated using silicon/CMOS compatible materials and processes.

Our IR photodetector is based on a metal-insulator-semiconductor (MIS) structure or metal-insulator-metal (MIM) structure. The metal layer on the top of the detector absorbs light and generates excited photoelectrons. Kinetic energy of the electrons is dependent on the photon energy/wavelength of the incident light. The shorter the wavelength, the higher the energy of the photoelectrons. The metal/insulator interface provides a potential barrier. Only electrons that have large enough energy can overcome this barrier and reach the electrode on the other side of the insulator, whether semiconductor or metal, and generate electrical an output signal. In embodiments, the other side of the insulator is a semiconductor or a metallic substrate. Electrons generated by light with longer wavelengths, which have less energy, cannot overcome the energy barrier and thus are blocked by the insulating layer between metal and substrate. The metal/insulator interfacial energy barrier can be adjusted for a targeted IR wavelength range.

Figure 1:
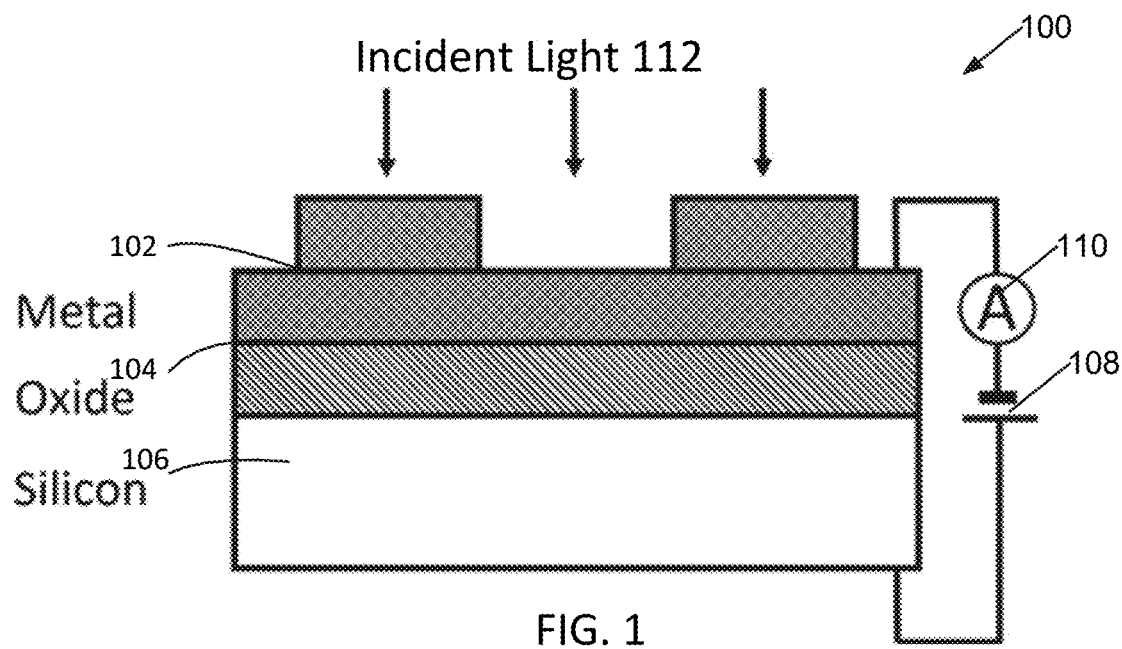
FIG. 1 is a schematic of a MIS(MOS) structure. The Oxide layer is made of insulating materials such as silicon dioxide, silicon nitride, or silicon oxynitride, and the semiconductor substrate is made of silicon or other semiconductor or metallic materials. Light is incident from the metal side.

An embodiment of an IR detector with Metal-insulator-semiconductor (MIS) structure is illustrated in FIG. 1. The IR detector 100 has a light absorber layer 102, an insulating layer 104 and a substrate 106. For example, the light absorber can be made of metal (M), the insulating layer can be made of insulator (I), and the substrate (S) can be semiconductor (S) or in alternative embodiments metallic materials (M). For simplicity, in this document, this structure can be described as a metal-oxide-semiconductor (MOS) structure. The light absorber is the metal layer, the insulating layer corresponds to the oxide layer and the substrate is a semiconductor layer. The materials used in each part/layer of these devices are not limited to such choices. For example, the metal layer can be metal alloy instead of pure metal, and the semiconductor substrate can be a silicon or a germanium substrate.

The light absorber metallic layer includes metal or metallic materials. It can be pure metal such as tin (Sn), aluminum (Al) or gold (Au), or metal alloy such as Aluminum-Copper-Silicon (AuCuSi) alloy Al—Sn, or a conductive silicide such as Nickel Silicide (NiSi), Platinum Silicide (PtSi), or other alloys. Unless graphene is used, the light absorber metallic layer is between 10 and 100 nanometers thick. The metallic layer absorbs incident photons and generates electrons with relative high excessive energy. The work function of the metallic material, which is the minimum thermodynamic energy needed to remove an electron from the solid material to vacuum outside the solid surface, affects the working wavelength of the sensor. The sensor receives incoming light 112 and operates with an applied voltage 108 and electronic circuitry 110 adapted to measure photocurrent in the sensor. Details will be discussed below.

Figure 2:
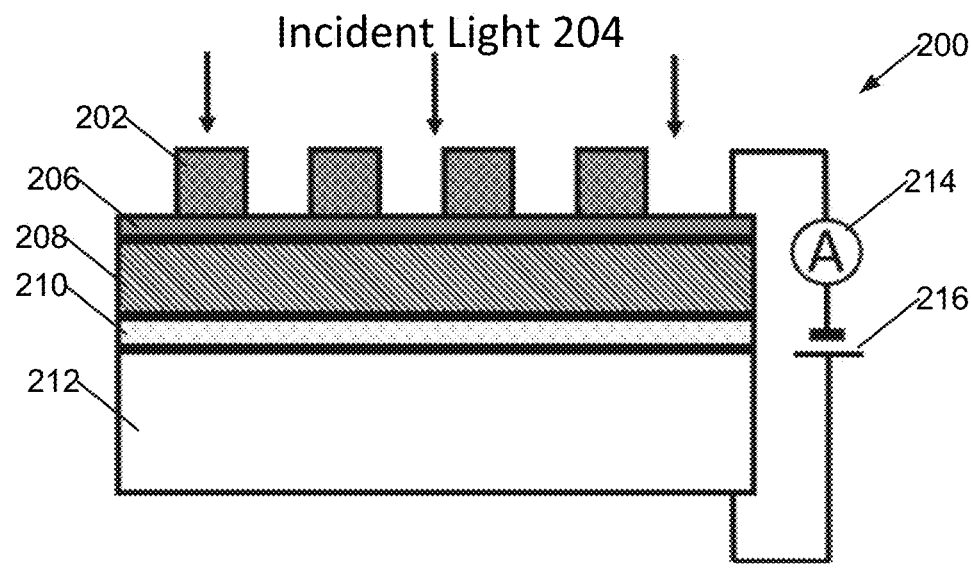
FIG. 2 is a schematic of an MIM device structure with graphene as the metallic absorber. Additional light trapping structure is applied to enhance light absorption in the graphene layer.

Another material usable for this light absorber is a two-dimensional material such as graphene. Graphene, a monatomic sheet from of carbon (C) is a zero-gap semiconductor with tunable Fermi energy. Previous studies have shown that graphene and semiconductor can form a Schottky barrier. Because graphene is metallic at a sufficiently large Fermi energy, in this document it will be referred to as a metallic material unless otherwise specified. A schematic figure for a graphene-based MIM device is shown in FIG. 2, having metal structures 202 configured to interact with incoming light 204 and disposed on a graphene layer 206. The graphene layer 206 lies on a thin insulator layer 208. An optional conductive reflector layer 210 may lie under the insulator layer 208, and is formed on a conductive substrate layer 212. The sensor has an applied voltage 216 between the substrate layer 212 and the graphene layer 206, and operates with electronic circuitry 214 configured to measure photocurrent in the sensor.

The light absorber metal layer 202, 102, is designed to absorb light (preferably with wavelength between 700 nm and 1 mm) and generate photon-excited electrons. When photons are absorbed in this layer, some electrons in the metal layer gain all the energy from the photons. Thus these electrons have larger kinetic energy than other free electrons in the metal layer. This process is photon excitation. Kinetic energy of such electrons can be as high as a few eV, according to the energy level of the incident photons. Since the energy of photon E is related to the wavelength λ in such form:

$$E = h\frac{c}{\lambda}$$

where c is the speed of light and h is Plank constant, we see light with shorter wavelength has greater energy. Thus electrons excited by light at a shorter wavelength, such as IR light at 1550 nanometers (nm), have greater energy than those excited by light at longer wavelength, such as IR light at 2000 nm.

Figure 4A:
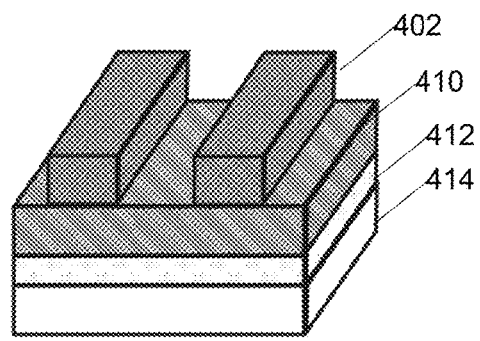
FIG. 4A illustrates a metallic grating structure designs for enhancing light absorption near metal/oxide interface incorporating a 2D grating structure on top of thin metal film.
Figure 4B:
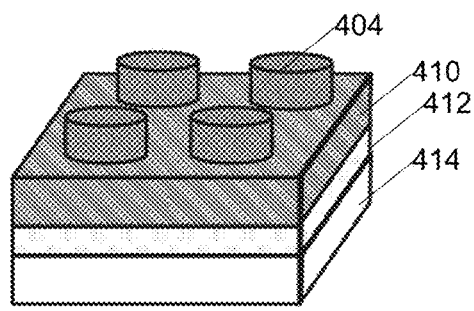
FIG. 4B illustrates a metallic grating structure design for enhancing light absorption near metal/oxide interface incorporating a metal dot or pellet structure on top of thin metal or graphene film, this structure is polarization-independent and mimics the self-assembled Sn nanograting structure prepared in experiments.

To enhance IR light absorption at a wide range of incident angles, nanophotonic structures are built on top of, within or under this metallic layer. Such structures include but are not limited to gratings 402 (FIG. 4A), domes, pyramids, dots/pellets 404 (FIG. 4B), or disks. Each of these structures lies over a full sheet of conductive metal or graphene 410, an oxide insulator 412, and a semiconductor or metallic substrate 414. These structures on top of the metallic layer are typically from ten nanometers to three hundred nanometers thick. For a particular embodiment having self-assembled deposited tin (Sn) nanostructures for use at 1550 nm wavelength these structures are 150 nm in thickness. These structures have dimensions close to one wavelength of the light for which the sensor has peak sensitivity, for a photosensor having peak sensitivity at 1550 nanometers with round dot structures, the dot structures should have diameters between 1000 and 2000 nanometers and in a particular embodiment 1550 nanometers. For peak sensitivity of 1000 nanometers, the dot structures should have dimensions between 700 and 1300 nanometers. In embodiments the dot structures have diameters between 50 and 2500 nanometers. For a photosensor having a grating structure and peak sensitivity of 1550 nm, the grating line pitch should approximately match the wavelength in the grating material, i.e. the wavelength in the vacuum divided by the refractive index of the grating material. As many embodiments of photosensors as herein described are designed for wavelengths between 700 and 2000 nanometers wavelength, grating pitches of between 100 and 2000 nanometers are appropriate to approximately match those wavelengths.

Figure 4C:
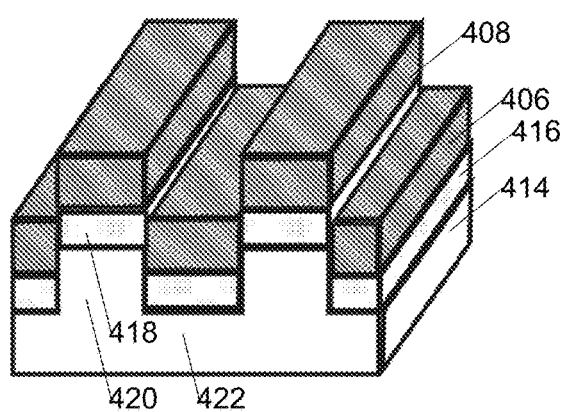
FIG. 4C illustrates a dual-level metallic grating structure designs for enhancing light absorption near metal/oxide interface on semiconductor substrate; this concentrates more incident light will be concentrated towards metal/insulator interfaces.

In an alternative embodiment, FIG. 4C, in order to concentrate photoelectrons at the interface of oxide insulator 412 and metal absorber, the metal absorber is formed of a grating on a first 406 and second 408 layer. Each grating layer is formed over a finger of oxide insulator 416, 418, lying over ridges 420 and valleys 422 of semiconductor or metallic substrate 414.

Figure 4D:
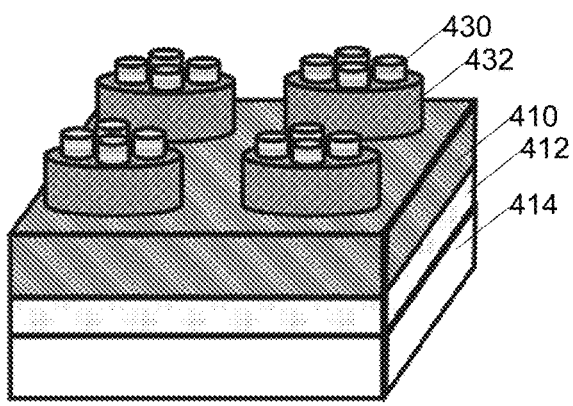
FIG. 4D illustrates a dual-level metallic structure for enhancing light absorption on semiconductor substrate that combines lithography and self-assembly technique to produce a multispectral absorber with two kinds of feature sizes and periodicity. The larger features (dots with larger period and size) can be made with lithography and smaller features (dots with smaller period and size) can be made with self-assembly.

In another alternative embodiment, FIG. 4D, in order to absorb photoelectrons at several specific wavelengths in the IR region, an upper metal absorber layer has self-assembled structures 430 lying on top of mask-defined structures 432 lying over a full sheet of conductive metal or graphene 410, an oxide insulator 412, and a semiconductor or metallic substrate 414.

Such nanostructures can be fabricated in various ways, such as lithography including photolithography and electron beam lithography, lift-off techniques with nanospheres and other templates, such as Anode Aluminum Oxide membranes, and self-assembly.

To optimize the design of the nanophotonic structure, take a figure of merit (FOM) as light absorption near the metal/oxide interface. Since "hot" (excited) electrons excited by incident light need to transport through the metal, across the oxide insulator, and then towards semiconductor or metal substrate, it is desirable to reduce the total distance and reduce the possibility of inelastic scattering of these electrons during the transport process. Previous studies have shown the mean free path of hot electrons in noble metal (Au/Ag/Cu) is quite short (a few tens of nm). So we set the FOM as the light absorption within 100 nm from metal/oxide interface. Numerical simulations can be used to find an optimized design as shown in FIG. 5A-5B.

Figure 5C:
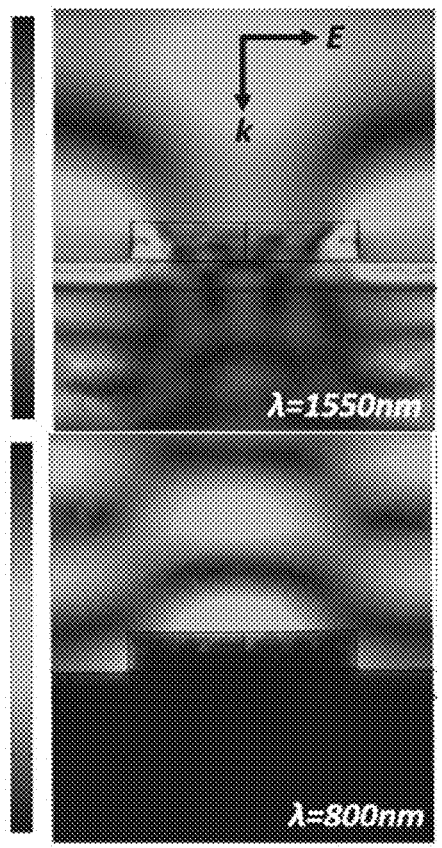
FIGS. 5A-5C illustrate a configuration of the nanophotonic structure with Sn/TiO2/Si, FIG. 5A showing a perspective view of the layout, FIG. 5B showing a graph of wavelength versus absorption efficiency.
Figure 5A:
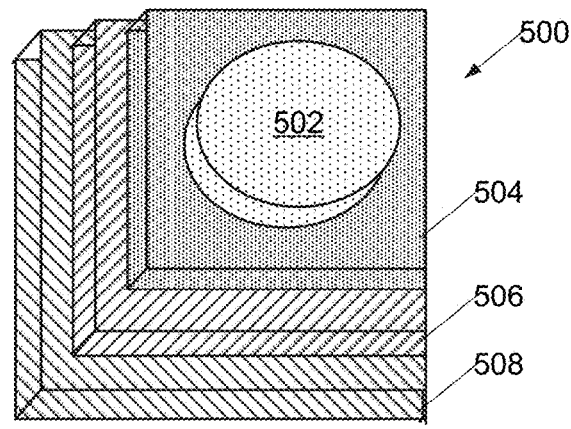
Figure 5B:
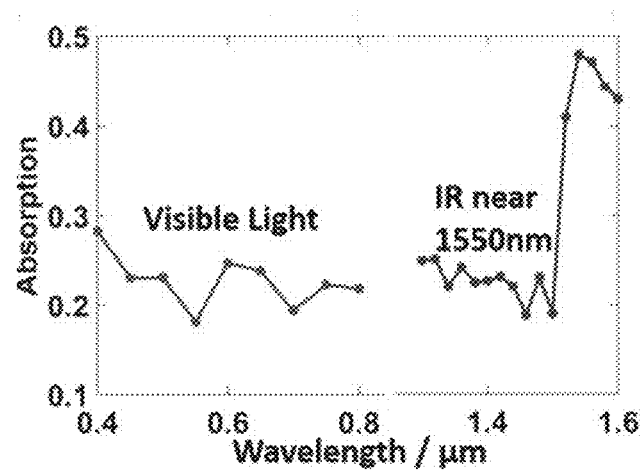

In the design 500 of FIG. 5A, a circular discoidal nanostructure 502 of tin overlies a thin tin absorber layer 504, in turn overlying a titanium dioxide (TiO2) insulator layer 506, in turn overlying a semiconductor or metallic substrate 508.

To fabricate such nanophotonic structures, both lithography and self-assembly techniques are applied. Lithography, including photo-lithography and electron beam lithography provides a well-controlled and precise method for making metallic grating structures. For IR application, the metallic gratings have a period near 1 um and other feature sizes, including width, and radius, of a few hundreds of nm. These are achievable by current lithography methods. Another method is to utilize the self-assembled nanostructure of deposited metallic materials.

Figure 6A:
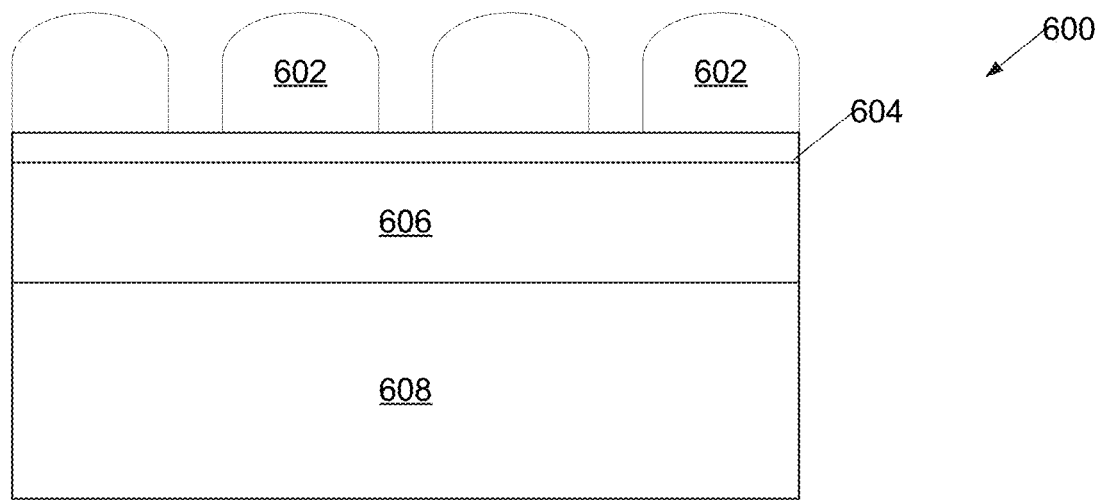
FIGS. 6A and 6B illustrate light trapping structures on single-layer graphene (SLG).
Figure 6B:
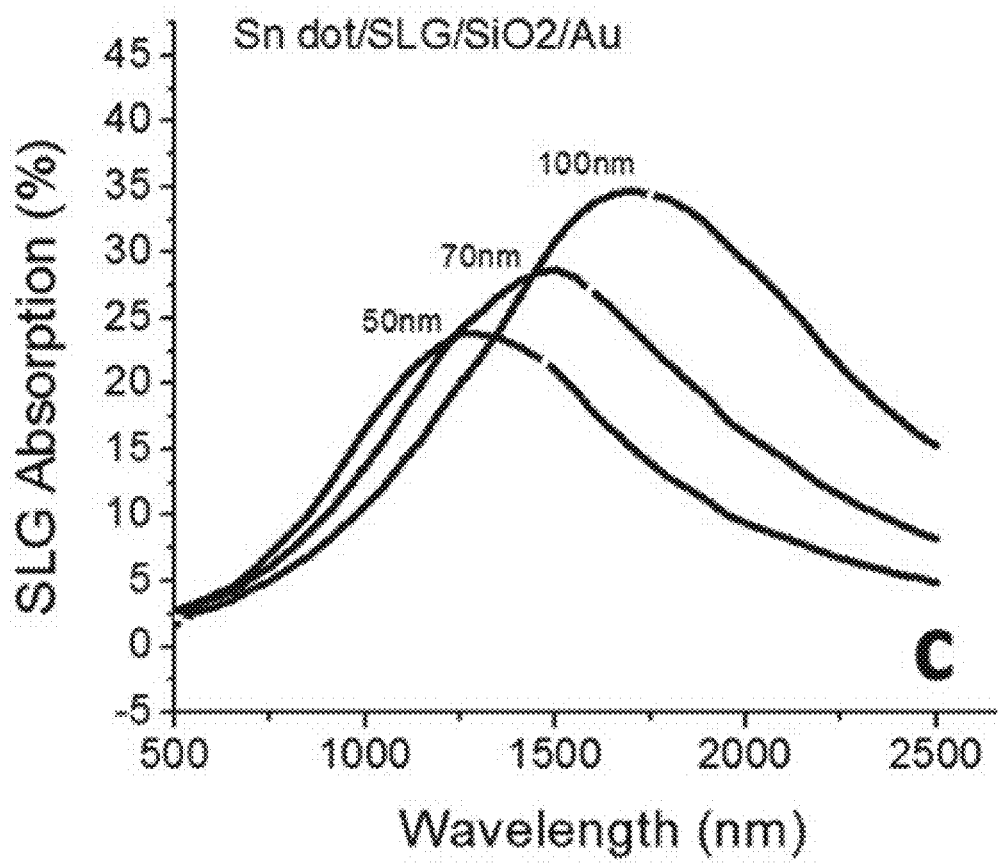

FIGS. 6A and 6B illustrate light trapping structures on single-layer graphene (SLG). FIG. 6A is a cross-section of a light trapping structure 600 having Sn (tin) dots 602 on single layer graphene 604, with dielectric materials ($SiO_2$) 606 beneath, all overlying a semiconductor or metal substrate 608. FIG. 6B illustrates a light absorption spectrum of SLG with various SiO2 dielectric film thicknesses. While this representation the dielectric thin film is $SiO_2$, other dielectric materials such as $TiO_2$, $SnO_x$ ($1 \leq x \leq 2$), single layer hexagonal boron nitride (h-BN), and others may function. The metal can be Au, Al, Cu, Ag, silicides, or other metallic materials.

Figure 7:
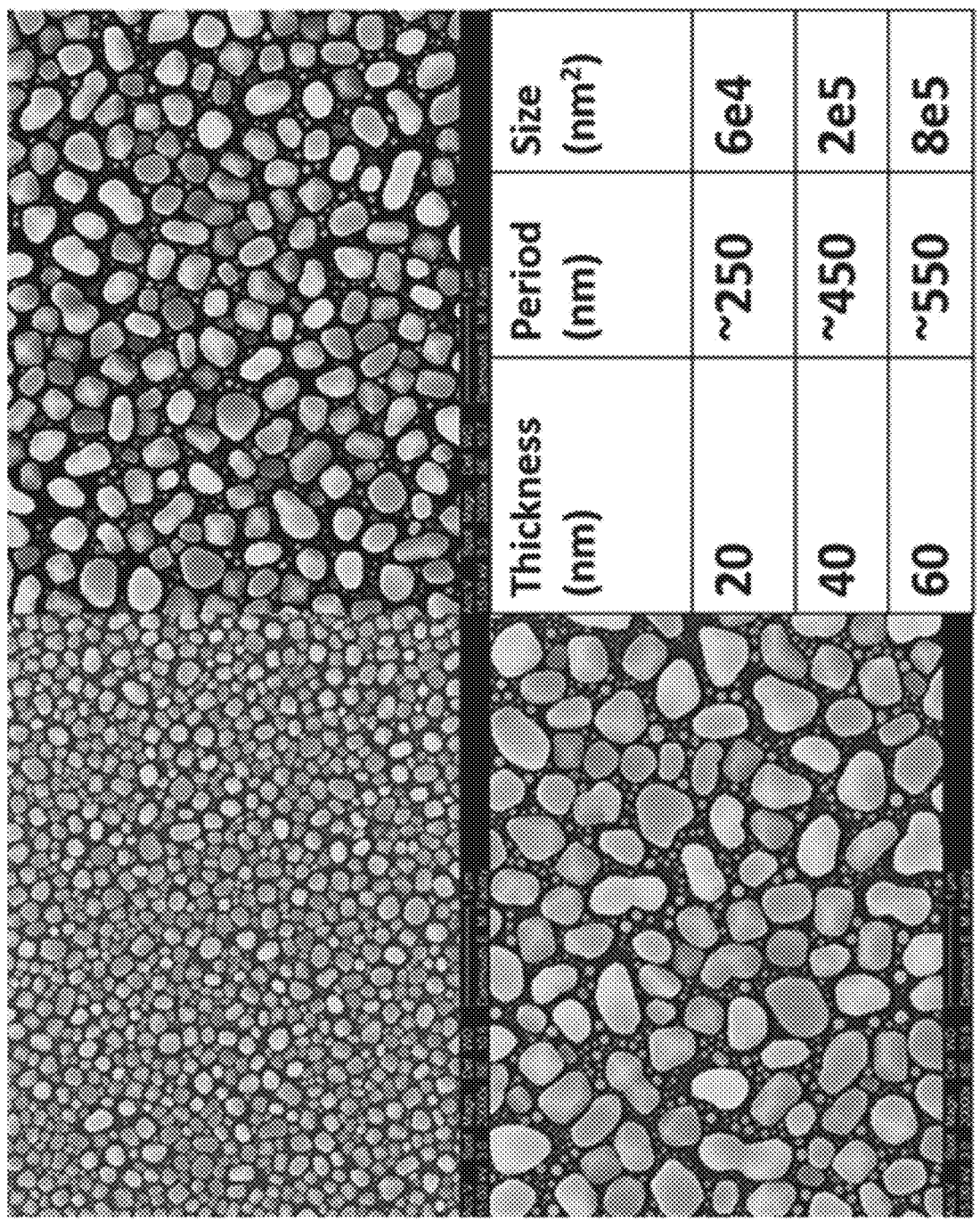
FIG. 7 is scanning electron microscopy images of self-assembled structures of deposited Sn with varying nominal thickness.

As shown in FIG. 7, thermally evaporated Sn on Si substrates forms dots with varying sizes. Fast Fourier transform (FFT) analysis shows that the dots are pseudo-periodic. The average period and size of the dots is determined by Sn deposition conditions, such as nominal Sn thickness. In this way, a large area of periodic metallic nanostructures can be fabricated without the expense of masks and lithography.

Moreover, two types of fabrication techniques can be applied together to form a broad band or multispectral absorber or absorber with a more controlled absorbing regime, as shown in FIG. 4 (d). The lithography helps prepare larger features and self-assembly adds smaller features. The larger features (structure with larger period and size) can be optimized for maximum IR absorption and smaller features (structure with smaller period and size) can be optimized for maximum visible light reflection or increase the bandwidth of IR absorption by adding another resonant peak.

The nanophotonic structures can also be designed for maximum reflectance for unwanted incident light, such as visible light for IR detector. They can be designed to reflect much of incident visible light while maintain relative high IR absorption. This helps reduce noise and interference from visible light. As shown in FIG. 5B, absorption within 100 nm of the metal/oxide for 1550 nm incident light is ~48% while the average absorption for visible light is about 25%.

Other structures such as a distributed Bragg reflector (DBR) can also be added to achieve same goal of reflecting much of visible light. Such a filter may include layers of a first and a second transparent material having different refractive indexes, where each layer is approximately one-quarter wavelength thick at a particular wavelength for maximum reflection.

The metal layer is also used as one of the electrodes of the detector so the conductance of metal, both vertical and lateral, is preferably high.

To further increase light absorption within metal layer, a backside reflector can be added as substrate to reflect the light that is transmitted through the metal-oxide-semiconductor device. Such a reflector can be made from metallic materials such as Al, Au, Cu, etc. which have high reflection at IR wavelengths. This configuration works well in IR region where semiconductor absorption is minimal.

As for graphene and other two-dimensional materials, since they are extremely thin and native light absorption is very low (1-2% for single layer), overlying nanophotonic structure is desirable. The FOM of such structure is the light absorption of graphene. One exemplary light trapping design uses Sn dots and backside reflector, as illustrate in FIG. 6A-6B. The preliminary results indicate that light absorption of single layer graphene can be increased to >40% on a dielectric layer on metal substrate.

The insulating layer only allows electrons of high kinetic energy to pass. Dielectric materials (Sift for example) block electric current between the light absorber layer and the substrate without illumination. However, electrons with high enough kinetic energy cross a very thin layer of dielectric material without losing any energy by "ballistic transport". So in this device, those light excited electrons with sufficient energy can cross through such insulating layer while other electrons cannot. The oxide material is a material with proper electron affinity X such that the interfacial barrier height $\phi_B=W-X$ is smaller than the photon energy of interest, where W is the work function of the metal. It should also have a high breakdown electric field >500 kV/cm. Possible choices of oxide material include $SiO_2$, AlN, $TiO_2$, $SnO_x$ ($1 \leq x \leq 2$) etc. Another candidate for the insulating layer is a two dimensional material with high band gap, such as hexagonal boron nitride (h-BN). For simplicity, this layer is referenced as "oxide" herein.

The substrate can be a semiconductor material such as Silicon for example, preferably with low electrical resistance and high electron concentration. It can also be a metallic material layer on the substrate, as the back reflector for better light trapping, a Au layer on silicon or quartz, for example. IR excited electrons which transport through insulating layer will reach the substrate and be collected at the substrate.

Figure 3:
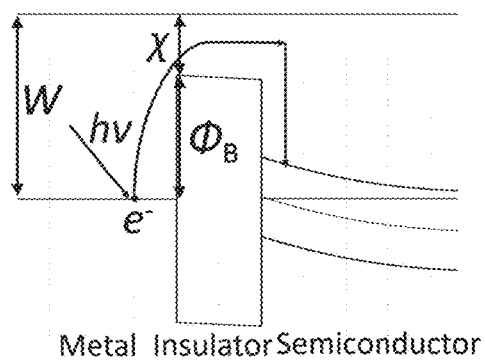
FIG. 3 is a graph depicting the electronic band structure of the MIS structure of the present devices. Note the insulator thickness and barrier height is not to scale.

The choice of materials for the metal and oxide layers is of crucial importance. As shown in FIG. 3, the energy barrier height $\phi_B$ is determined by a metal work function W and dielectric layer electron affinity X.

$$\phi_B = W - X$$

Light absorption in the metal layer generates photo-excited electrons and some of them transport towards the oxide layer. If these electrons have kinetic energy greater than $\phi_B$ they will overcome this energy barrier and reach the conduction band of Si on the other side of oxide layer. Otherwise, the electrons are blocked by the oxide layer. The insulating properties of the oxide layer not only eliminate dark current but also prevent photoresponse from photons absorbed by semiconductor region since the oxide layer blocks carriers originating in the semiconductor.

The thickness of oxide is great enough to prevent electrons with low energy transporting to Si via direct tunneling or other process, yet is thin enough to prevent electron energy loss during transport. For example, if $SiO_2$ is used, the proper oxide thickness for such devices is about 10 nm. Typically the thickness range is between one and fifty nanometers for all oxide insulator layers herein disclosed, unless a 2D insulator such as h-BN is used, when thickness may be one-third of a nanometer.

The energy barrier height can be adjusted by controlling oxide material. This barrier height determines the threshold wavelength (the longest wavelength that can be detected) of the detector. For example, by choosing Au for metal layer and $SnO_2$ for oxide layer, the barrier height is around 0.9 eV. This is suitable for near IR (NIR) light detection from 780 nm to 1378 nm. Another example is Sn for metal layer and $TiO_2$ for oxide layer. This will gives a barrier height of 0.5 eV, suitable for IR light with wavelength shorter than 2480 nm, including the important telecommunication wavelengths of 1310 nm and 1550 nm. The insulating oxide layer significantly reduces the dark current (the electrical signal that is not generated by target light input), which can be optimized by controlling the oxide thickness. They also offer a much better interface with Si than metal/Si contacts. Compared to metal/semiconductor Schottky junction devices, this device has less noise.

A particular embodiment of this MOS configuration uses metal (plasmonic metal, Sn) as a light absorber, titanium oxide as insulating layer and n-type Si as substrate. The thickness of titanium oxide is about 10 nm and the metal thin film is 100 nm thick. The Si substrate is phosphorus doped at a level of 1e18 $cm^{-3}$. The thickness of the substrate is about 1 um. On top of the metal thin film, periodic metal (Sn) dots are added for more light absorption. For working wavelength of 1550 nm, the optimum period of Sn dots is 1500 nm, the radius of the dots is 450 nm and the height of the dots is 150 nm. Such Sn metal structures can be fabricated by photolithography and thermal evaporation using the lift-off technique. This enhances the light absorption within 100 nm from $Sn/TiO_2$ interface up to 48%, 40% higher than a bare 100 nm Sn thin film. The potential barrier height is 0.5 eV, blocking response to IR light with wavelength longer than 2480 nm.

Another exemplary embodiment of this device has single or multiple layers of graphene as absorber, single or multiple layers of h-BN as dielectric layer and silicon or metal as substrate. Sn dot structure can be deposited on top of graphene as light trapping structure and metal thin film, such as 100 nm thick Au can be deposited on the backside of substrate as reflector to enhance light absorption within graphene. The potential barrier height between graphene and h-BN is 0.5 eV, blocking response to IR light with wavelength longer than 2480 nm.

Figure 8:
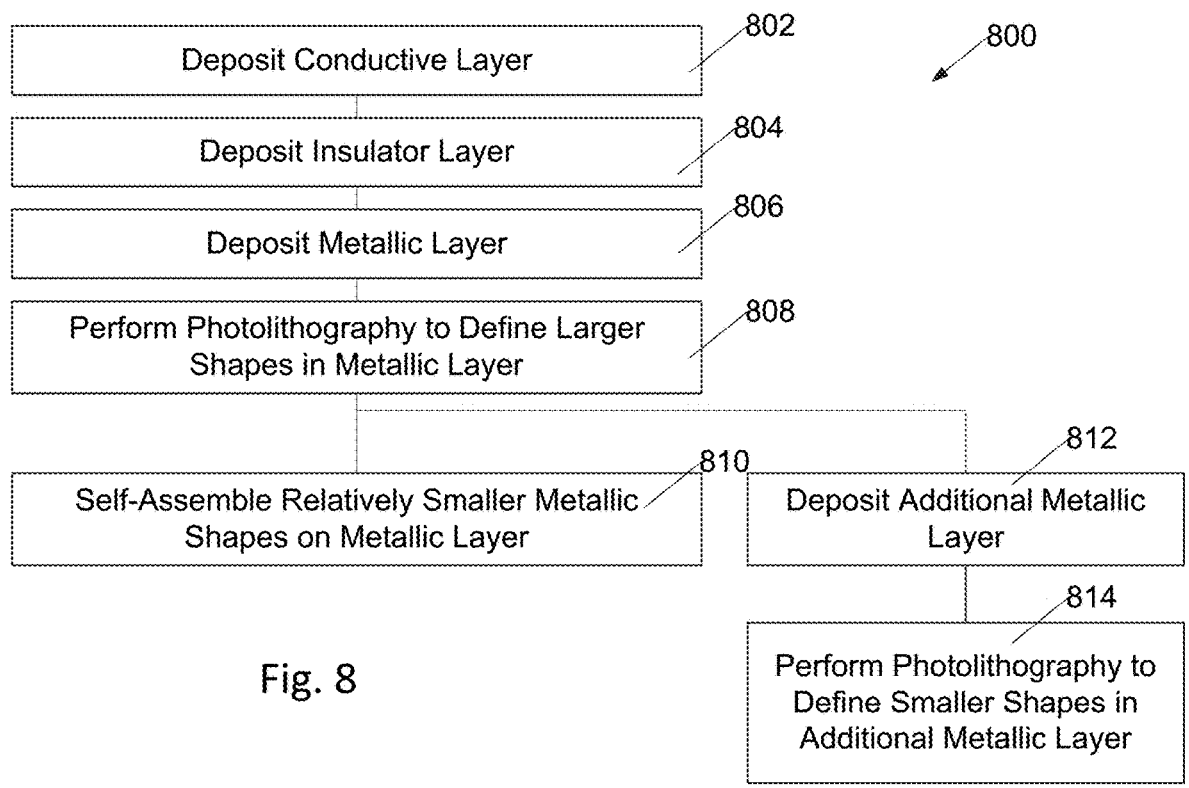
FIG. 8 is a flowchart illustrating a method of manufacture of the MIS/MIM structures herein described.

In some embodiments, the devices herein described are formed according to the method 800 of FIG. 8. A conductive layer 608 is deposited 802, in a particular embodiment on a flexible plastic substrate. Atop conductive layer 608 is deposited 804 an insulator layer 606 selected from the insulating oxides herein described, and atop insulator layer 606 is deposited 806 a metallic layer 604. Shapes are defined in metallic layer 604 may be defined by lithography 808, a purpose of such shapes is to both define absorber structures and a metallic grid for providing electrical contact to the metallic layer. After the lithography, self-assembled tin dots may be formed 810 atop metallic layer 604, or an upper metallic layer may be deposited 812. If an upper metallic layer is deposited 812, small shapes are then formed in that layer with lithography 814. Additional metal layers (not shown) may be deposited and defined with lithography to provide electrical contact to the metallic layers herein described, and additional insulator layers (not shown) may be deposited to protect and insulate the photosensor.

Combinations:

The photosensors herein described may embody various combinations of features, some of which are detailed here.

In an embodiment designated A, a metal-insulator-conductor infrared photodetector has a metallic infrared light absorber layer of thickness no more than one hundred nanometers configured to generate electrons with a first kinetic energy upon absorption of photons of the infrared light; a layer of dielectric material of thickness between one-third and fifty nanometers configured to allow passage of electrons having the first kinetic energy while blocking electrons having a second kinetic energy; a conductive layer; wherein the metallic infrared light absorber layer is disposed on the layer of dielectric material, the layer of dielectric material being disposed on the conductive layer.

A metal-insulator-conductor infrared photodetector designated AA includes the embodiment designated A wherein the metallic infrared light absorber layer is a metal.

A metal-insulator-conductor infrared photodetector designated AB includes the embodiment designated A wherein the metallic infrared light absorber layer is metal silicide.

A metal-insulator-conductor infrared photodetector designated AC includes the embodiment designated A wherein the metallic infrared light absorber layer is graphene.

A metal-insulator-conductor infrared photodetector designated AD includes the embodiment designated A, AA, AB, or AC, further including a periodic or quasi-periodic structures having thickness between ten and three hundred nanometers disposed on the metallic infrared light absorber layer.

A metal-insulator-conductor infrared photodetector designated AE includes the embodiment designated AD wherein the periodic or quasi-periodic structure comprises a structure selected from the group consisting of a grating, dots, and a self-assembled structure.

A metal-insulator-conductor infrared photodetector designated AF includes the embodiment designated AE wherein the periodic or quasi-periodic structure comprises dots or self-assembled structures having typical shape diameters between 50 and 2500 nanometers.

A metal-insulator-conductor infrared photodetector designated AG includes the embodiment designated AF wherein the dots or self assembled structures have typical shape diameters between 50 and 2000 nanometers.

A metal-insulator-conductor infrared photodetector designated A4 includes the embodiment designated AE wherein the periodic or quasi-periodic structure comprises a grating having pitch between 100 and 2000 nanometers.

In a method designated B of fabricating the metallic nanostructure for optical absorption and photodetection includes depositing a metallic layer; performing lithography to define shapes having relatively larger feature sizes and periods; and depositing self-assembled metallic structures with periods and sizes smaller than the lithography features.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method of detecting infrared light comprising:
   providing a periodic or quasi-periodic conductive structure comprising a grating having thickness between ten and three hundred nanometers disposed on a metallic infrared light absorber layer of thickness no more than one hundred nanometers disposed on a dielectric layer of thickness between one-third and fifty nanometers and configured to allow passage of electrons having a first kinetic energy and to block electrons of a second kinetic energy, the dielectric layer disposed on a conductive layer;
   absorbing infrared light of a first wavelength on at least one of the periodic or quasi-periodic conductive structure and the metallic infrared light absorber layer, generating, in at least one of the periodic or quasi-periodic conductive structure or the metallic infrared light absorber layer, electrons of the first kinetic energy upon absorbing the first wavelength of infrared light and electrons of the second kinetic energy upon absorbing light of a second wavelength of infrared light;
   passing the electrons of the first kinetic energy through the dielectric layer, the dielectric layer blocking passage of electrons of the second kinetic energy; and
   collecting the electrons of the first kinetic energy on the conductive layer.

2. The method of claim 1 wherein the metallic infrared light absorber layer comprises a metal.

3. The method of claim 1 wherein the metallic infrared light absorber layer comprises metal silicide.

4. The method of claim 1 wherein the metallic infrared light absorber layer comprises graphene.

5. The method of claim 1 wherein the periodic or quasi-periodic structure further comprises shapes having typical shape diameters between 50 and 2500 nanometers.

6. The method of claim 5 wherein the shapes have typical shape diameters between 100 and 2000 nanometers.

7. The method of claim 1 wherein the periodic or quasi-periodic structure comprises a grating having pitch between 100 and 2000 nanometers.

8. The method of claim 7 wherein a periodic or quasi-periodic structure comprising shapes smaller than a pitch of the grating are provided atop the grating having pitch between 100 and 2000 nanometers.

9. A method of fabricating an infrared detection device comprising:
   forming a conductive collector layer;
   forming, atop the conductive collector layer, a dielectric layer having thickness between one-third and fifty nanometers;
   forming, atop the dielectric layer, a metallic absorber layer of thickness of no more than one hundred nanometers; and
   depositing a metallic shape layer of thickness between ten and three hundred nanometers;
   performing lithography to define shapes in the metallic shape layer and;
   depositing self-assembled metallic structures with periods and sizes smaller than the shapes defined by lithography.

10. The method of claim 9 wherein the shapes in the metallic shape layer comprise a grating having pitch between 100 and 2000 nanometers.

11. The method of claim 9 wherein the shapes in the metallic shape layer comprise dots having diameter between 500 and 2500 nanometers.

* * * * *